US012777617B2

(12) United States Patent
Gregory et al.

(10) Patent No.: US 12,777,617 B2
(45) Date of Patent: Oct. 27, 2026

(54) SYSTEMS AND METHODS FOR CRYOGENIC COOLING

(71) Applicant: Microsoft Technology Licensing, LLC, Redmond, WA (US)

(72) Inventors: Luke Thomas Gregory, Mercer Island, WA (US); Rick Chun Kit Cheung, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 525 days.

(21) Appl. No.: 17/851,333

(22) Filed: Jun. 28, 2022

(65) Prior Publication Data

US 2023/0422444 A1 Dec. 28, 2023

(51) Int. Cl.

*H05K 7/20* (2006.01)
*F25B 19/00* (2006.01)
*G06F 1/20* (2006.01)

(52) U.S. Cl.

CPC ....... *H05K 7/20372* (2013.01); *F25B 19/005* (2013.01); *G06F 1/20* (2013.01); *H05K 7/20309* (2013.01); *H05K 7/20327* (2013.01)

(58) Field of Classification Search

CPC ........... H05K 7/20345; H05K 7/20372; H05K 7/20254; H05K 7/2029; H05K 7/20309; H05K 7/20327; H01L 23/4336; H01L 23/4735; F28D 2021/0031; F28D 2021/0033; F25B 19/005; G06F 1/20

USPC ........................ 62/52.1, 259.2; 361/700, 702

See application file for complete search history.

(56) References Cited

U.S. PATENT DOCUMENTS

| | | | | |
|---|---|---|---|---|
| 4,745,760 | A | 5/1988 | Porter | |
| 4,866,570 | A | 9/1989 | Porter | |
| 5,023,695 | A * | 6/1991 | Umezawa | H01L 23/4735 257/714 |
| 6,349,760 | B1 | 2/2002 | Budelman | |
| 2006/0262503 | A1 | 11/2006 | Bevan et al. | |
| 2009/0284911 | A1 * | 11/2009 | Morehead | G06F 1/206 361/679.47 |

OTHER PUBLICATIONS

"International Search Report and Written Opinion Issued in PCT Application No. PCT/US23/022628", Mailed Date: Sep. 28, 2023, 10 Pages.

* cited by examiner

*Primary Examiner* — Joel M Attey
*Assistant Examiner* — Ibrahim A. Michael Adeniji
(74) *Attorney, Agent, or Firm* — Ray Quinney & Nebeker P.C.; Paul N. Taylor

(57) ABSTRACT

A computing system and related methods are described. The computing system includes a heat-generating component. The computing system includes an evaporation plate thermally connected to the heat-generating component. The computing system includes a cryogenic cooling system positioned proximate to the evaporation plate. The cryogenic cooling system is configured to release a cryogenic fluid onto the evaporation plate to cool the heat-generating component. The cryogenic fluid has a boiling point of less than 273 K.

20 Claims, 10 Drawing Sheets

SYSTEMS AND METHODS FOR CRYOGENIC COOLING

CROSS-REFERENCE TO RELATED APPLICATIONS

N/A.

BACKGROUND

Modern computing devices are increasing in processing power and complexity, while simultaneously decreasing in size. During operation, these computing devices generate heat. As computing devices experience both increased processing power and reduced size, a cooling system may be used to transfer the generated heat away from the processor. In some situations, a processor may experience increased performance at lower temperatures. Examples of cooling systems include ventilation systems, cold plates, immersion cooling systems, vapor chambers, heat pipes, and so forth.

BRIEF SUMMARY

In some aspects, the techniques described herein relate to a computing system. The computing system includes a heat-generating component, an evaporation plate thermally connected to the heat-generating component, and a cryogenic cooling system positioned proximate to the evaporation plate. The cryogenic cooling system is configured to release a cryogenic fluid onto the evaporation plate to cool the heat-generating component, the cryogenic fluid having a boiling point of less than 273 K.

In some aspects, the techniques described herein relate to a cryogenic cooling system. The cryogenic cooling system includes a cryogenic tank configured to store a cryogenic fluid having a boiling point of less than 273 K and an inlet pipe from the cryogenic tank to an opening in the inlet pipe. The opening of the inlet pipe is configured to be located proximate to an evaporation plate thermally connected to a heat-generating component. A valve is connected to the inlet pipe, the valve being actuatable to release the cryogenic fluid.

In some aspects, the techniques described herein relate to a method for cooling a computing device. The method includes generating heat at a heat-generating component, the heat-generating component being thermally connected to an evaporation plate, applying a cryogenic fluid to the evaporation plate, the evaporation plate causing the cryogenic fluid to change phase to a gas, a boiling point of the cryogenic fluid being less than 273 K, and exhausting the gas of the cryogenic fluid to atmosphere.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 1-2 is a representation of a cross-sectional view of the computing system of FIG. 1-1;

FIG. 2 is a representation of a cross-sectional view of a computing system having a cryogenic cooling system, according to at least one embodiment of the present disclosure;

FIG. 3-1 and FIG. 3-2 are representations of a computing system connected to a cryogenic cooling system, according to at least one embodiment of the present disclosure;

DETAILED DESCRIPTION

Figure 1:
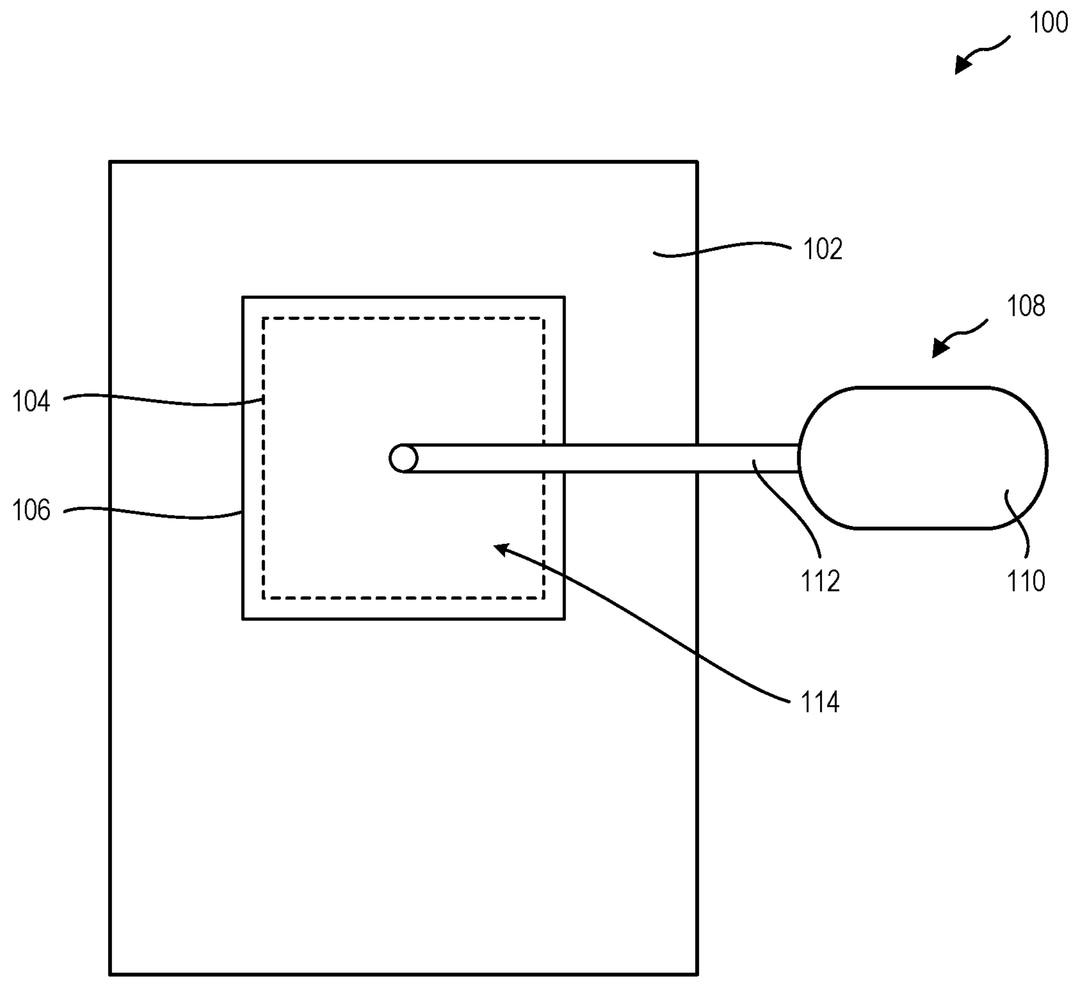
FIG. 1-1 is a representation of a computing system having a cryogenic cooling system, according to at least one embodiment of the present disclosure.

This disclosure generally relates to devices, systems, and methods for using cryogenic fluids to cool processors. As processors operate, they generate heat. This may cause the temperature of the processor to increase. As the temperature of the processor increases, the processor may experience decreased computing efficiency and, in some situations, be damaged. Indeed, some computing systems may experience increased computing capacity at lower temperatures. A computing system may include a cooling system that may transfer heat generated by the processor away from the processor. Cooling systems include fans that blow air across the processor, a cold plate connected to the processor with a chilled fluid passed through pipes in the cold plate, a network of vapor chambers and/or heat pipes connected to the processor, immersion cooling systems, any other type of cooling system, and combinations thereof. Such cooling systems may have a lower cooling temperature limit, based on the structure of the cooling system.

In accordance with at least one embodiment of the present disclosure, a cryogenic cooling system may not only transfer heat generated by the processor away from the processor, but may also cool the processor to a cold operating temperature. The cryogenic cooling system may include an evaporation plate thermally connected to the processor. A cryogenic fluid may be placed on the evaporation plate. The cryogenic fluid may be colder than the evaporation plate (and the connected processor). When the cryogenic fluid is placed on the evaporation plate, it may reduce the temperature of the evaporation plate, thereby reducing the temperature of the processor. For example, heat from the processor (including heat generated due to processing activities and/or heat absorbed through the environment) may be absorbed by the cryogenic fluid. In some situations, this may cause the cryogenic fluid to boil or change phase from a fluid to a gas. This may reduce the temperature of the evaporation plate (and the thermally connected processor). In some situations, this may reduce the temperature of the evaporation plate (and the thermally connected processor) to at or near the boiling point of the cryogenic fluid.

In some embodiments, the boiling point of the cryogenic fluid is less than the temperature to which a conventional cooling system may lower the processor. For example, the cryogenic fluid may include liquid nitrogen (e.g., $N_2$). Liquid nitrogen has a boiling point of approximately 77 K at 1 atmosphere of pressure. In this manner, by using liquid nitrogen as the cryogenic fluid, the cooling system may lower the temperature of the boiling plate and/or the processor to at or near 77 K. This may allow for increased computing capacity of the processor. In some embodiments, a lower processor temperature allows for increased processor density (e.g., increased amounts or numbers of processors in the same volume of space). This may allow for smaller server racks and/or more servers to be placed in a rack or datacenter.

As illustrated by the foregoing discussion, the present disclosure utilizes a variety of terms to describe features and advantages of the cryogenic cooling system. Additional detail is now provided regarding the meaning of such terms. For example, as used herein, the term "cryogenic fluid" refers to a cooling fluid used in a cryogenic cooling system. In particular, the term cryogenic fluid can include any fluid that may boil or change phase from a fluid to a gas upon contact with an evaporation plate. In some embodiments, a cryogenic fluid is gaseous at standard temperature and pressure (STP) (e.g., 273 K and 1 atm). To illustrate, a cryogenic fluid can include a supercooled fluid, such as liquid nitrogen, liquid oxygen, liquid helium, liquid argon, any other cryogenic fluid, and combinations thereof.

In some embodiments, the cryogenic fluid is inert in both liquid and gaseous form. Put another way, the cryogenic fluid may not cause chemical reactions with any of the components into which it may come in contact. In some embodiments, the cryogenic fluid is dielectric in both liquid and gaseous form. Put another way, the cryogenic fluid may not conduct electricity between any components with which it may come into contact (thereby causing a short between elements of the computing device).

As used herein, a "boiling point" may be the temperature at which the cryogenic fluid may change phase from a liquid to a gas. While the present disclosure may describe the boiling point of a cryogenic fluid based on a reference pressure of 1 atm, it should be understood that the cooling system may be implemented under conditions having a different pressure than 1 atm. This may adjust the boiling point from any values stated herein. However, such changes in pressure, which may result from changes in altitude and/or barometric pressure, are within the scope of the present disclosure.

FIG. 1-1 is a representation of a top-down view of a computing system 100, according to at least one embodiment of the present disclosure. The computing system 100 may include a base 102 such as a printed circuit board, server tray, or other base. In some embodiments, a processor 104 is located on the base 102. An evaporation plate 106 may be thermally connected to the processor 104. The processor 104 may transfer heat to the evaporation plate 106.

The processor 104 may be, generally, a heat-generating component. A heat-generating component may include any component of a computing system 100 configured to generate heat. For example, the heat-generating component may include one or more computing components, such as a processor, memory, switch, transistor, relay, communication element, any other heat-generating component, and combinations thereof. In some embodiments, the heat-generating component includes a power supply, such as a power source, a battery, a power connection, a power switch, a fuse, a switch, a resistor, any other power supply, and combinations thereof. As will be understood, the heat-generating component may include any component that may generate heat on a computing system 100.

A cryogenic cooling system 108 may be connected to the computing system 100. The cryogenic cooling system 108 may include a cryogenic tank 110 and an inlet pipe 112. The cryogenic tank 110 may provide storage for a cryogenic fluid. The inlet pipe 112 may provide a fluid pathway from the cryogenic tank 110 to the evaporation plate 106. The inlet pipe 112 may end at an opening 114. Cryogenic fluid may flow from the cryogenic tank 110 to the opening 114.

The cryogenic tank 110 may be configured to store the cryogenic fluid. In some embodiments, the cryogenic tank 110 is an insulated tank. The insulated tank may help to prevent the cryogenic fluid from prematurely changing phase (e.g., from boiling away before the cryogenic fluid contacts the evaporation plate 106). In some embodiments, the insulated tank is actively cooled to below the boiling point of the cryogenic fluid.

In some embodiments, the inlet pipe 112 is insulated. For example, the inlet pipe 112 may include insulation wrapped around the inlet pipe 112. This may help to prevent premature boiling of the cryogenic fluid as it travels between the cryogenic tank 110 and the opening 114. In some embodiments, the insulation around the inlet pipe 112 helps to prevent condensation from forming on the inlet pipe 112. For example, the cryogenic fluid passing through the inlet pipe 112 may cool the inlet pipe 112. In some embodiments, the cryogenic fluid cools the inlet pipe 112 to below a dewpoint of the environment or atmosphere in which the computing system 100 is located. The dewpoint may be the temperature below which atmospheric air may be lowered until the air achieves a relative humidity of 100%. At temperatures below the dewpoint, moisture in the air may precipitate. For example, when the inlet pipe 112 is cooled to below the dewpoint, moisture in the air may precipitate on the outer surface of the inlet pipe 112. In some situations, precipitated moisture from the air may drip on other hardware components of the computing system 100. This may damage the computing system 100.

In accordance with at least one embodiment of the present disclosure, the insulation around the inlet pipe 112 may isolate the outer surface of the inlet pipe 112 from the atmosphere. In some embodiments, the insulation reduces the transfer of heat from the inlet pipe 112 to the atmosphere sufficiently to prevent the temperature of the inlet pipe 112 from being reduced to below the dewpoint. This may help to prevent condensation from collecting on the inlet pipe 112 and dripping onto hardware or other components of the computing system 100.

The cryogenic fluid may flow out of the opening 114 and onto the evaporation plate 106. When the cryogenic fluid contacts the evaporation plate 106, the cryogenic fluid may absorb heat from the evaporation plate and/or the environment (e.g., the atmosphere). This may lower the temperature of the evaporation plate 106. Because the evaporation plate 106 is thermally connected to the processor 104, this may cause the temperature of the processor 104 to be lowered. This may help to shed heat from the processor 104, lower the operating temperature of the processor 104, and increase the computing capacity of the processor.

In accordance with at least one embodiment of the present disclosure, the gaseous cryogenic fluid may be exhausted to the atmosphere. For example, the computing system 100 may be located in a housing. When the cryogenic fluid is released onto the evaporation plate 106, the cryogenic fluid may boil or change phase from a liquid to a gas. The computing system 100 may include one or more fans that may blow the generated gas out of the housing and into the environment and/or the atmosphere. Exhausting the gas to the atmosphere (e.g., exhausting the gas into an atmospheric environment or an atmospheric system) may include exhausting the gas out of the computing system, including exhausting out of the housing, exhausting out of the rack, exhausting out of the room in which the computing system 100 is used, exhausting out of the building, or otherwise exhausting out of the proximity or vicinity of the 100. In some embodiments, the gas is naturally exhausted, or changes in volume, pressure, and temperature may cause the gas to exhaust away from the computing system 100. In some embodiments, an active ventilation system exhausts the gas away from the computing system 100 to prevent the gas from displacing oxygen in the area, thereby creating a working hazard for technicians and other operators working with the computing system 100.

As discussed herein, the cryogenic fluid may include liquid nitrogen. Liquid nitrogen is inert. Indeed, gaseous nitrogen comprises approximately 78% of the earth's atmosphere. Releasing the gaseous nitrogen (converted from liquid nitrogen) into the atmosphere may be harmless and/or may simplify the cryogenic cooling system 108. For example, releasing the gaseous nitrogen into the atmosphere may allow the cryogenic cooling system 108 to not include (e.g., operate without) a collection mechanism for the gaseous nitrogen.

Figures 1, 2:
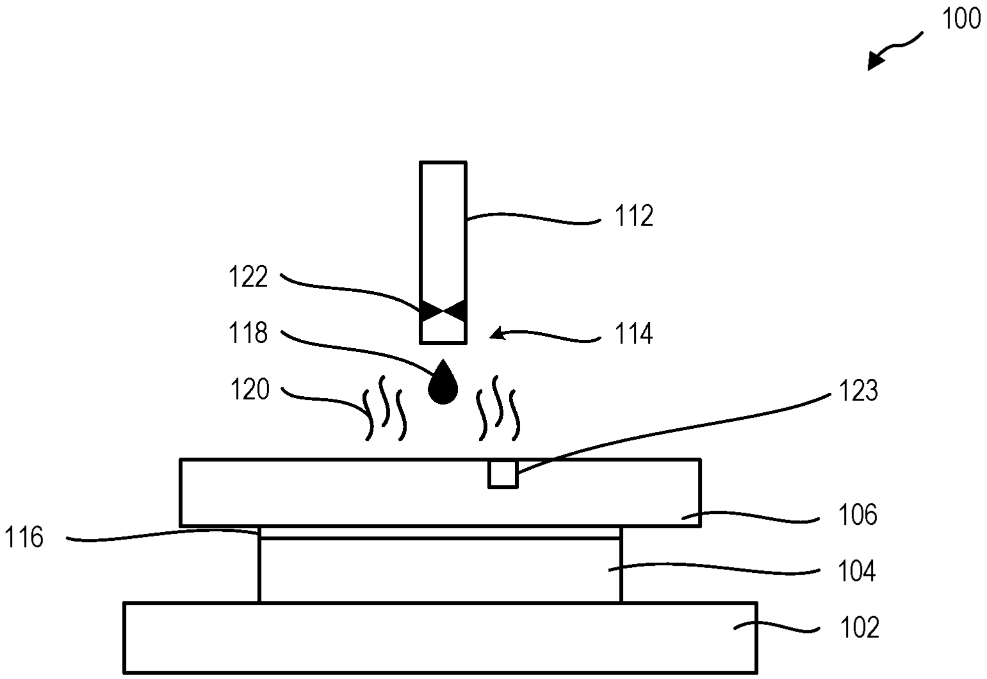
Figure 2:
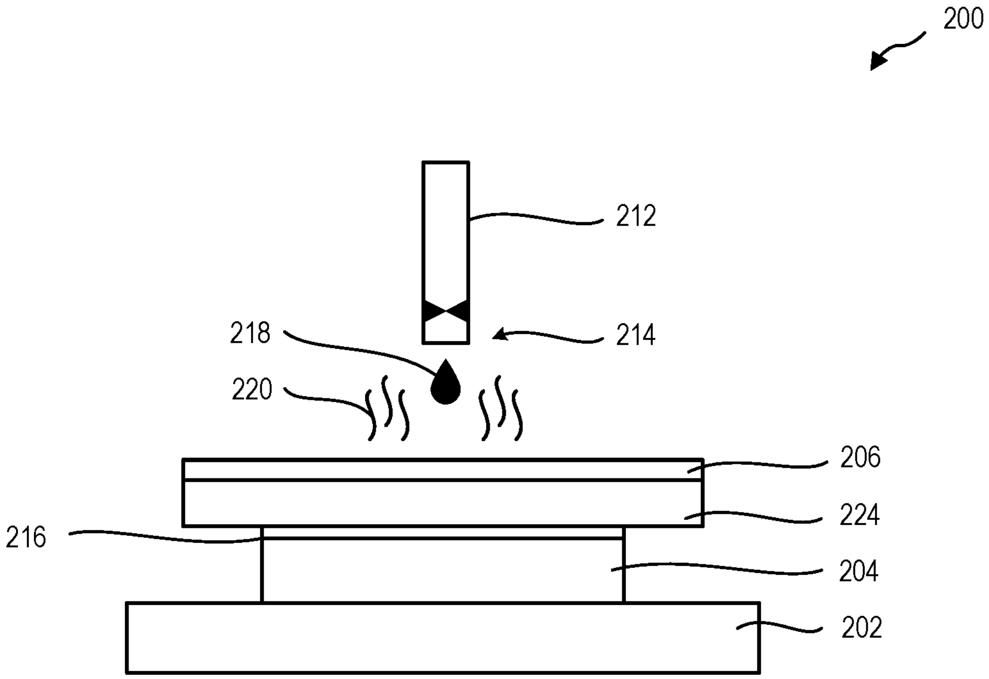

FIG. 1-2 is a representation of a cross-sectional view of the computing system 100 of FIG. 1-1. As may be seen, the processor 104 may be placed on top of the base 102. The evaporation plate 106 may be located on top of the processor 104. As discussed herein, the evaporation plate 106 may be thermally connected to the processor 104. For example, a thermal interface material (TIM) 116 may be located between the processor 104 and the evaporation plate 106. The TIM 116 may be any type of TIM. For example, the TIM 116 may include a plurality of thermally conductive particles (e.g., metal, or other thermally conductive material formed into spherical or spheroidal shapes). The thermally conductive particles may be suspended in a flowable suspension media, such as naphtha, oil, silicon, or other flowable material. The TIM 116 may be flowed into the gap between the processor 104 and the evaporation plate 106. As the processor 104 generates heat, the TIM 116 may transfer the heat from the processor 104 to the evaporation plate 106.

As discussed herein, the cryogenic cooling system 108 includes the inlet pipe 112 having the opening 114. A cryogenic fluid 118 may be released from the opening 114 to contact or engage the evaporation plate 106. When the cryogenic fluid 118 contacts the evaporation plate 106, the cryogenic fluid 118 may boil, or change phase from a liquid to a cryogenic fluid vapor 120. This may cause the evaporation plate 106 to cool down, causing the processor 104 to transfer additional heat to the evaporation plate 106 through the TIM 116.

In some embodiments, the cryogenic fluid vapor 120 is exhausted to another portion of the cryogenic cooling system. For example, the cryogenic fluid vapor 120 may be used to cool other processors, other components of the computing system 100, HVAC cooling systems, or otherwise used to cool other elements of the computing system 100 or related infrastructure.

In some embodiments, the cryogenic fluid 118 causes the evaporation plate 106 and/or the processor 104 to be lowered to a temperature that is below the ambient temperature of the environment or ambient temperature of the atmosphere in which the computing system 100 is located. For example, before use, the temperature of the processor 104 and/or the evaporation plate 106 may become normalized to or near to the ambient temperature of the environment and/or the atmosphere in which the computing system 100 is located. Because the cryogenic fluid 118 may have a boiling point of below the ambient temperature, when the cryogenic fluid 118 exits the opening 114 and enters the atmosphere and/or contacts the evaporation plate 106, the cryogenic fluid 118 may boil, thereby drawing heat from the evaporation plate 106 and the processor 104 (via the thermal connection of the TIM 116).

In some embodiments, the cryogenic fluid 118 is continuously applied (e.g., one drip followed by another drip) to the evaporation plate 106 until the evaporation plate 106 is at or near the boiling point of the cryogenic fluid 118. This may reduce the temperature of the processor 104 to at or near the boiling point of the cryogenic fluid 118. In some embodiments, the operating temperature of the processor 104 is subject to any thermal losses in the thermal pathway between the processor 104 and the evaporation plate 106. For example, the operating temperature of the processor 104 may be higher than the temperature of the evaporation plate 106 based on thermal losses and/or the time it takes for the heat to transfer from the processor 104 to the evaporation plate 106.

In some embodiments, the operating temperature of the processor 104 is lowered before operation of the processor 104. For example, prior to use, the cryogenic cooling system 108 may apply the cryogenic fluid 118 to the evaporation plate 106 to reduce the operating temperature of the processor 104 prior to the processor 104 performing any heat-generating functions, such as processing. This may allow the processor 104 to begin processing activities at or near the operating temperature, thereby improving performance of the processor 104 during the entirety of use of the processor 104.

In some embodiments, the cryogenic cooling system 108 applies the cryogenic fluid 118 to the evaporation plate 106 during operation of the processor 104. For example, the processor 104 may have an overclocked mode. In the overclocked mode, the processor 104 may operate at a supercooled temperature. When the processor 104 is entering the overclocked mode, the cryogenic cooling system 108 may cause the cryogenic fluid 118 to be applied to the evaporation plate 106, reducing the operating temperature of the processor 104 and thereby increasing the computing capacity of the processor 104.

In some embodiments, as will be discussed further herein, the cryogenic cooling system 108 applies the cryogenic fluid 118 to the evaporation plate 106 in response to an operating temperature and/or a plate temperature of the evaporation plate 106. When the operating temperature of the processor and/or the plate temperature of the evaporation plate 106 is determined to be above a threshold temperature, the cryogenic cooling system 108 may cause the cryogenic fluid 118 to be applied to the evaporation plate 106, thereby reducing the temperature of the evaporation plate 106 and/or the processor 104. This may allow the cryogenic cooling system 108 to apply the cryogenic fluid 118 to the evaporation plate 106 based on the operation of the processor 104.

The cryogenic cooling system 108 may apply the cryogenic fluid 118 to the evaporation plate 106 in any manner. For example, the cryogenic cooling system 108 may apply the apply the cryogenic fluid 118 to the evaporation plate 106 using a gravity fed system. The gravity fed system may use the force of gravity to flow the cryogenic fluid 118 through the inlet pipe 112 and out of the opening 114. The cryogenic tank 110 may be located above the evaporation plate 106 such that the cryogenic fluid 118 may flow through the inlet pipe 112 to the opening 114. In some embodiments, the cryogenic cooling system 108 applies the cryogenic fluid 118 to the evaporation plate 106 using a positive pressure system. For example, the cryogenic fluid 118 may be stored in the cryogenic tank 110 under pressure, and the pressure of the cryogenic fluid 118 may push the cryogenic fluid 118 through the inlet pipe 112 and out of the opening 114.

In accordance with at least one embodiment of the present disclosure, the cryogenic cooling system 108 may include a valve 122 in the inlet pipe 112 between the cryogenic tank 110 and the opening 114. In some embodiments, the valve 122 is actuatable to control a flow of the cryogenic fluid 118 between the cryogenic tank 110 and the opening 114. For example, the valve 122 may be connected to a control system, and the control system may actuate or open the valve 122 to release the cryogenic fluid 118 to the evaporation plate 106. As discussed herein, the cryogenic cooling system 108, including the cryogenic tank 110, may be located above the evaporation plate 106. In this manner, when the valve 122 is actuated or opened, the force of gravity may cause the cryogenic fluid 118 to flow out of the cryogenic tank 110, through the inlet pipe 112, and out of the opening 114 onto the evaporation plate 106. In some embodiments, when the valve 122 is actuated or opened, the positive pressure of the cryogenic tank 110 pushes the cryogenic fluid 118 out of the cryogenic tank 110, through the inlet pipe 112, and out of the opening 114 onto the evaporation plate 106.

In some embodiments, the valve 122 is a binary valve. For example, when the valve 122 is actuated, it may be either opened or closed. In the open position, the valve 122 may allow the cryogenic fluid 118 to pass through the valve 122 and out of the opening 114, and in the closed position, the valve 122 may prevent the cryogenic fluid 118 from passing through the valve 122 and out of the opening 114. In this manner, the cryogenic fluid 118 may either be flowing or not flowing.

In some embodiments, the valve 122 is a variable position valve, or may be actuatable between different positions. This may provide the cryogenic fluid 118 with a variable flow rate. For example, the valve 122 may be actuatable between multiple open positions. Each of the open positions may be associated with a different flow rate of the cryogenic fluid 118. This may result in a variable flow rate of the cryogenic fluid 118. A variable flow rate of the cryogenic fluid 118 may allow for different cooling rates of the cryogenic cooling system 108. In this manner, the cryogenic cooling system 108 may maintain the processor 104 at a particular operating temperature based on a heat generation of the processor 104. For example, the variable flow rate of the cryogenic fluid 118 may be adjusted based on the heat generation rate of the processor 104.

In accordance with at least one embodiment of the present disclosure, the cryogenic cooling system 108 may be located proximate to the evaporation plate 106. For example, the opening 114 of the inlet pipe 112 may be located proximate to the evaporation plate 106. In some embodiments, the opening 114 of the inlet pipe 112 is located proximate to the evaporation plate 106 such that a drop of the cryogenic fluid 118 may exit the opening 114 and drop to the evaporation plate 106 without simultaneously contacting both the opening 114 and the evaporation plate 106. In some embodiments, the opening 114 of the inlet pipe 112 is located proximate to the evaporation plate 106 such that a drop of the cryogenic fluid 118 may continuously flow from the 114 to the evaporation plate 106. In some embodiments, the opening 114 of the inlet pipe 112 is located proximate to the evaporation plate 106 such that the opening 114 is in contact with the evaporation plate 106. This may help to reduce the amount of the cryogenic fluid 118 that may evaporate between exiting the opening 114 and contacting the evaporation plate 106.

As discussed herein, in some embodiments, the cryogenic fluid 118 includes any type of cryogenic fluid 118. In some embodiments, the boiling point of the cryogenic fluid 118 is at any temperature. For example, the boiling point of the cryogenic fluid 118 may be below ambient temperature. In some examples, the boiling point of the cryogenic fluid 118 is below the freezing point of water. In some embodiments, the boiling point of the cryogenic fluid 118 is in a range having an upper value, a lower value, or upper and lower values including any of 100 K, 90 K, 80 K, 70 K, 60 K, 50 K, 40 K, 30 K, 20 K or any value therebetween. For example, the boiling point of the cryogenic fluid 118 may be greater than 20 K. In another example, the boiling point of the cryogenic fluid 118 may be less than 100 K. In yet other examples, the boiling point of the cryogenic fluid 118 may be any value in a range between 20 K and 100 K. In some embodiments, it is critical that the boiling point of the cryogenic fluid 118 is less than 273 K to reduce the operating temperature of the processor 104 and improve processing efficiency. In some embodiments, the boiling point of the cryogenic fluid 118 is less than 250 K, less than 225 K, less than 200 K, less than 175 K, less than 150 K, less than 125 K, less than 100 K, less than 75 K, or less than 50 K.

In accordance with at least one embodiment of the present disclosure, the evaporation plate 106 may be formed from a thermally conductive material. The evaporation plate 106 may be formed from any thermally conductive material, including a metal such as copper or steel alloys. In some embodiments, the evaporation plate 106 may be formed from a non-metal, such as graphite or other carbon-based thermally conductive material.

In some embodiments, the computing system 100 and/or the cryogenic cooling system 108 includes a temperature sensor 123. The temperature sensor 123 may be located at the evaporation plate 106 and/or the processor 104. The temperature sensor 123 may detect a plate temperature of the evaporation plate 106 and/or a processor temperature of the processor 104. In some embodiments, the cryogenic cooling system 108 determines whether the plate temperature and/or the processor temperature are above a cooling threshold. If the plate temperature and/or the processor temperature are above the cooling threshold, then the cryogenic cooling system may apply the cryogenic fluid 118 to the evaporation plate 106. For example, the cryogenic cooling system 108 may actuate or open the valve 122 to cause the cryogenic fluid 118 to flow onto the evaporation plate 106.

In some embodiments, as discussed herein, the cryogenic cooling system 108 determines a thermal output of the processor 104. For example, the cryogenic cooling system 108 may determine a rate of increase in temperature of the processor 104 and/or the evaporation plate 106. The rate of increase in temperature may be associated with the thermal output of the processor 104. In some embodiments, the cryogenic cooling system 108 actuates the valve 122 with a variable flow rate. The variable flow rate may be based on the thermal output of the processor 104. In this manner, the cryogenic cooling system 108 may maintain the plate temperature and/or the processing temperature at or below the cooling threshold.

In the embodiment shown in FIG. 1-2, the evaporation plate 106 is directly connected to the processor 104 (through the TIM 116). Put another way, the evaporation plate 106 is connected to the processor 104 without any other cold plate, heat mitigation structure, or other element between processor 104 (besides the TIM 116) and the evaporation plate 106. But in some embodiments, a thermal management device is located between the processor and the evaporation plate.

In FIG. 2 is a representation of a cross-sectional view of a computing system 200 having a thermal management device 224 between a processor 204 and an evaporation plate 206, according to at least one embodiment of the present disclosure. The computing system 200 may include a base 202 (such as a PCB or other base). The thermal management device 224 may be thermally connected to the processor 204. For example, the thermal management device 224 may be thermally connected to the processor 204 through a TIM 216.

In some embodiments, the evaporation plate 206 is thermally connected to the thermal management device 224. In some embodiments, the evaporation plate 206 is thermally connected to the processor 204 through the thermal management device 224. In some embodiments, the evaporation plate 206 is adhered or otherwise fixed to the thermal management device 224. In some embodiments, the evaporation plate 206 is integrally formed with the thermal management device 224. For example, the evaporation plate 206 may form an upper surface of the thermal management device 224.

In some embodiments, the thermal management device 224 is any type of thermal management device 224. For example, the thermal management device 224 may include a cold plate having pipes or passageways for a chilled fluid to pass into the thermal management device 224 and for the warmed fluid to pass out of the thermal management device 224. In some examples, the thermal management device 224 may include a vapor chamber, a series of radiating heat fins, a heat sink, any other type of thermal management device, and combinations thereof.

In some embodiments, a cryogenic cooling system passes a cryogenic fluid 218 through an inlet pipe 212 and out of an opening 214 above the evaporation plate 206. The cryogenic fluid 218 may be released from the opening 214 and engage or contact the evaporation plate 206. This may cause the cryogenic fluid 218 to boil or change phase from a fluid to a gas and transform into cryogenic fluid vapor 220.

In some embodiments, the thermal management device 224 is independently operable from the cryogenic cooling system. For example, the thermal management device 224 may cool the processor 204 in a first mode of operation. The first mode of operation may be associated with a higher operating temperature of the processor 204. As the processor 204 heats up during operation, the thermal management device 224 may absorb the generated heat. In some embodiments, with a cold plate thermal management device 224, the thermal management device 224 circulates fluid through it to absorb heat from the processor 204.

The processor 204 may enter a second mode of operation. For example, the processor 204 may enter an overclocked mode of operation. In the overclocked mode of operation, the cryogenic cooling system may release the cryogenic fluid 218 onto the evaporation plate 206 to further reduce the operating temperature of the processor 204. In some embodiments, the cooling fluid from a cold plate thermal management device 224 is drained from the thermal management device 224 to avoid freezing and breaking of the pipes in the cold plate. In some embodiments, the cooling fluid remains in the pipes of the thermal management device 224. In some embodiments, the cooling fluid remains liquid and circulating through the cold plate when cooled by the evaporation plate 206.

Figures 1, 3:
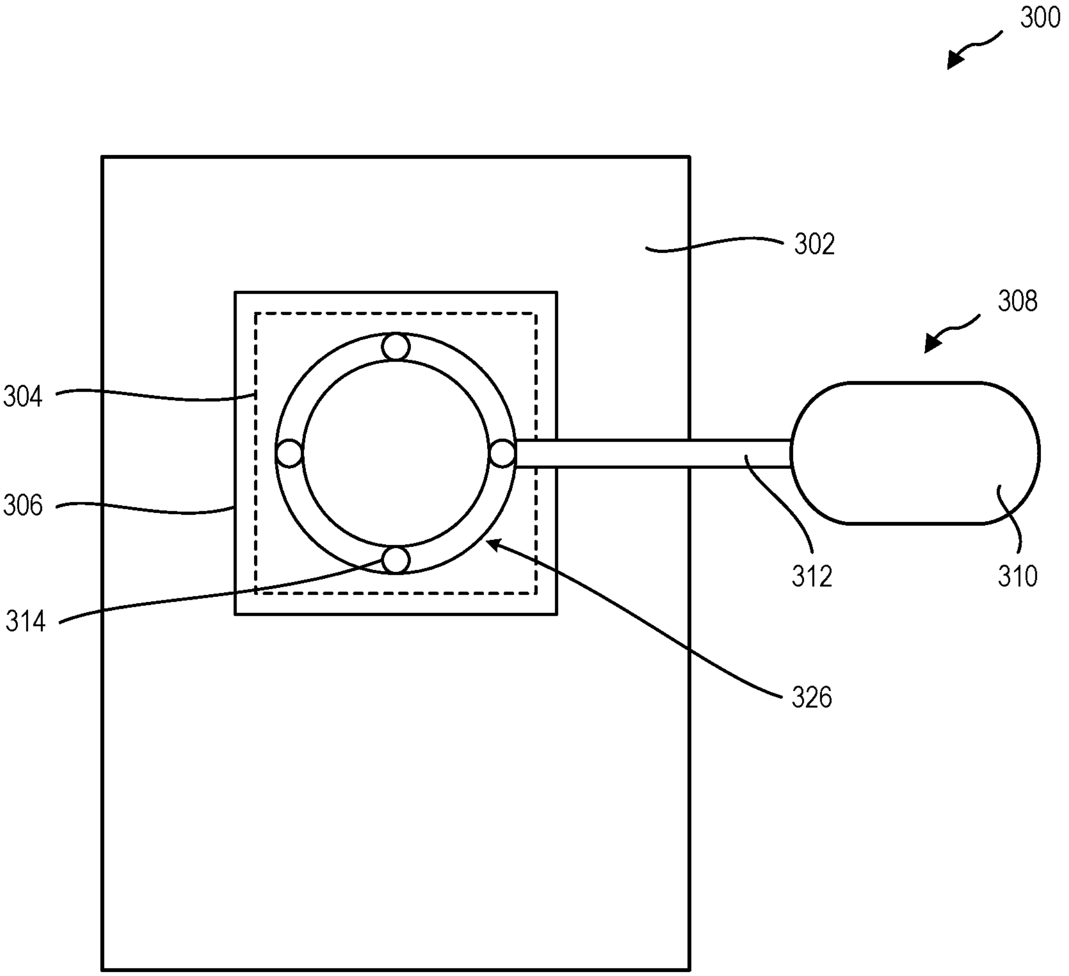
Figures 2, 3:
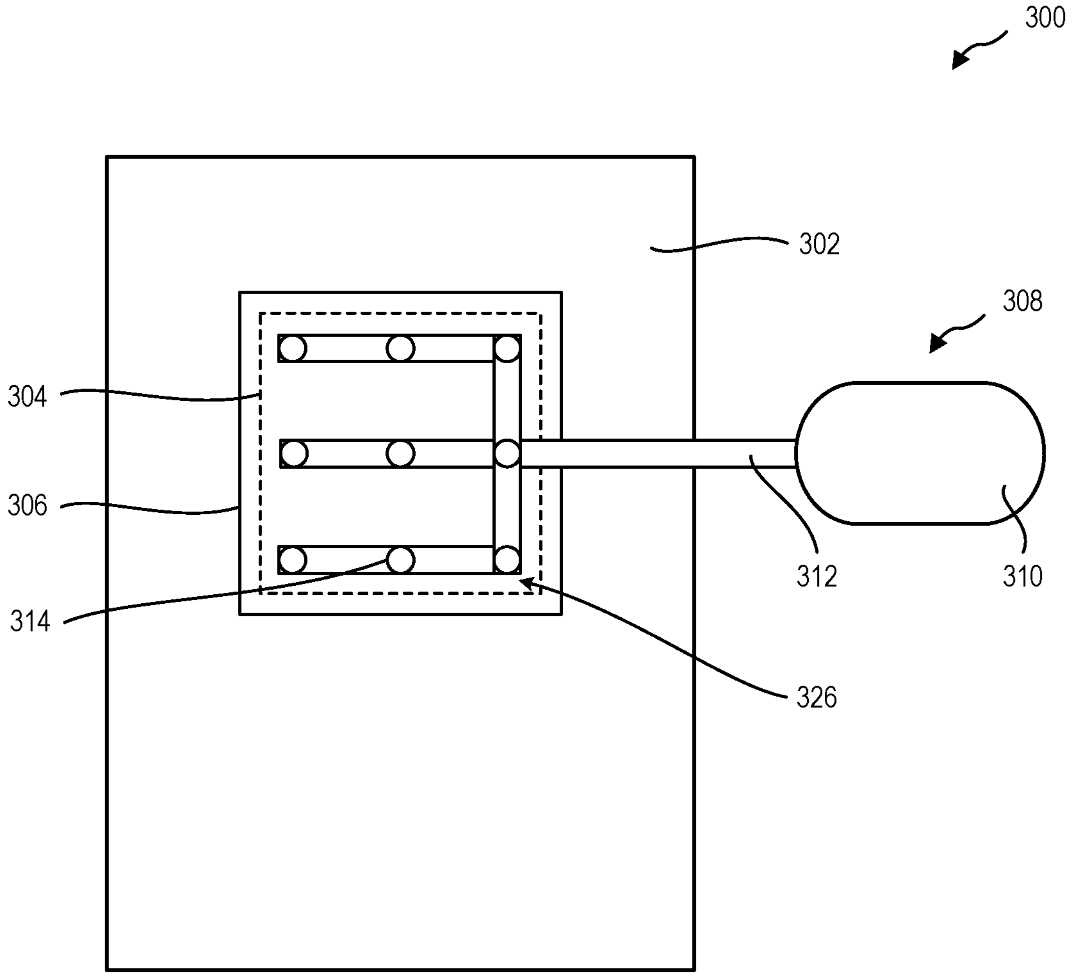

FIG. 3-1 and FIG. 3-2 are top-down views of a computing system 300 having a plurality of openings 314 for a cryogenic fluid to engage an evaporation plate 306, according to at least one embodiment of the present disclosure. The computing system 300 may include a base 302 such as a printed circuit board, server tray, or other base. In some embodiments, a processor 304 is located on the base 302. An evaporation plate 306 may be thermally connected to the processor 304. The processor 304 may transfer heat to the evaporation plate 306.

A cryogenic cooling system 308 may be connected to the computing system 300. The cryogenic cooling system 308 may include a cryogenic tank 310 and an inlet pipe 312. The cryogenic tank 310 may provide storage for a cryogenic fluid. The inlet pipe 312 may provide a fluid pathway from the cryogenic tank 310 to the evaporation plate 306. The inlet pipe 312 may end at a distribution pipe 326. Cryogenic fluid may flow from the cryogenic tank 310 to the distribution pipe 326. The distribution pipe 326 may distribute the cryogenic fluid to multiple opening 314 locations on the evaporation plate 306. For example, the distribution pipe 326 may include a plurality of openings 314. The openings 314 may release the cryogenic fluid onto the evaporation plate 306. This may allow the cryogenic fluid to cool a larger section of the evaporation plate 306, or to move evenly lower the temperature of evaporation plate 306.

In the embodiment shown in FIG. 3-1, the distribution pipe 326 has a circular shape. However, the distribution pipe 326 may have any shape and/or distribute the cryogenic fluid to the evaporation plate 306 in any pattern or manner. For example, in the embodiment shown in FIG. 3-2, the distribution pipe 326 is distributing the cryogenic fluid out of openings 314 in a grid pattern. For example, the distribution pipe 326 includes three rows of three openings 314. But it should be understood that the cryogenic cooling system 308 may include a distribution pipe 326 having any shape or pattern of openings 314.

Figure 4:
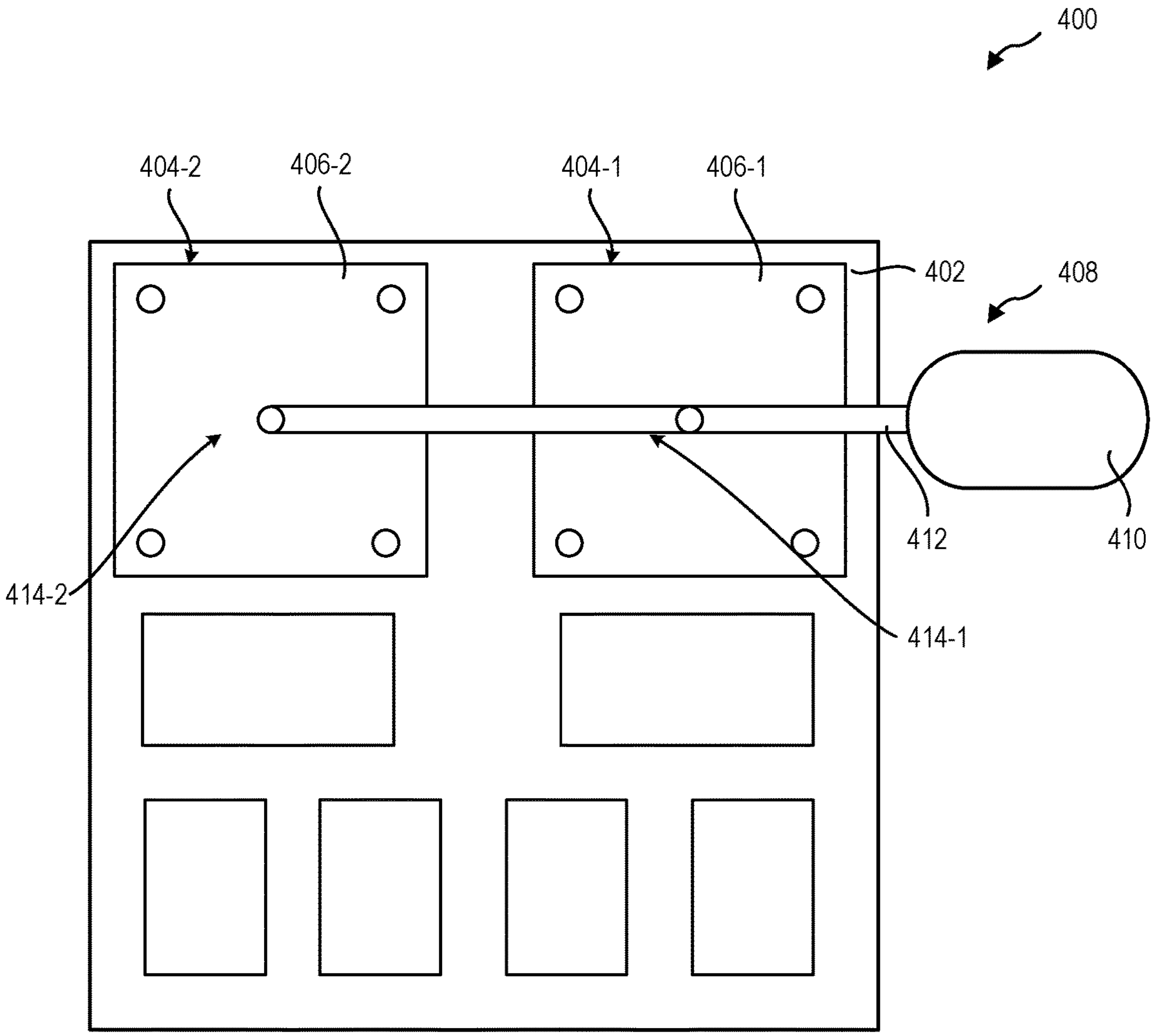
FIG. 4 is a representation of a computing system having a plurality of processors connected to a base, according to at least one embodiment of the present disclosure.

FIG. 4 is a representation of a computing system 400 having a plurality of processors (collectively 404) connected to a base 402, according to at least one embodiment of the present disclosure. In some embodiments, a cryogenic cooling system 408 provides a cryogenic fluid to a plurality of processors 404. For example, in the embodiment shown, the computing system 400 includes a first processor 404-1 and a second processor 404-2 connected to the base 402. A first evaporation plate 406-1 may be connected to the first processor 404-1 and a second evaporation plate 406-2 may be connected to the second processor 404-2.

The cryogenic cooling system 408 may include a cryogenic tank 410 having an inlet pipe 412 extending out of the cryogenic tank 410. The inlet pipe 412 may include a first opening 414-1 located proximate to the first evaporation plate 406-1 and a second opening 414-2 located proximate to the second evaporation plate 406-2. In this manner, the cryogenic cooling system 408 may provide cryogenic cooling system to each of the evaporation plates 406, thereby cooling each of the processors 404. This may allow the processors 404 to be located to closer together. In some embodiments, this increases the processor density, thereby allowing more processors to be placed in a smaller area. This may increase the number of processors used in a datacenter and/or reduce the size of the datacenter.

While the embodiment shown in FIG. 4 shows the two processors 404 being located on the same base 402, it should be understood that the cryogenic cooling system 408 may be used to provide cryogenic fluid to any number of processors 404. In some embodiments, the processors 404 are located on different bases 402. In some embodiments, the processors 404 are located on different server trays. In some embodiments, the processors 404 are located at different elevations in the same rack. In some embodiments, the cryogenic tank 410 may provide the cryogenic fluid to a manifold that may deliver the cryogenic fluid to each processor and associated evaporation plate on a particular server, server tray, rack, row of racks, or data center.

Figure 5:
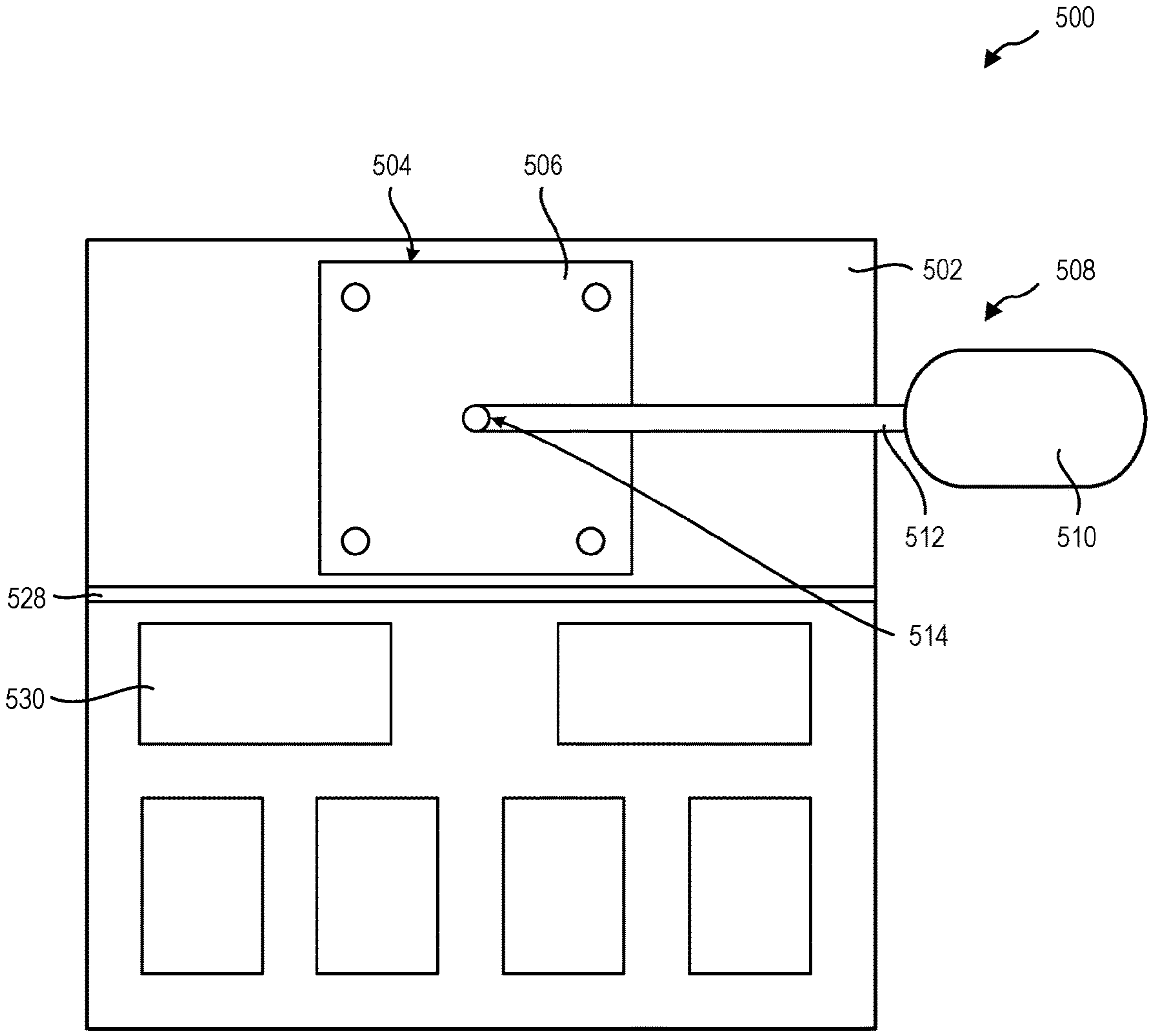
FIG. 5 is a representation of a computing system having a processor and an evaporation plate thermally connected to the processor, according to at least one embodiment of the present disclosure.

FIG. 5 is a representation of a computing system 500 having a processor 504 and an evaporation plate thermally connected to the processor, according to at least one embodiment of the present disclosure. The computing system 500 may include a base 502 such as a printed circuit board, server tray, or other base. The processor 504 may transfer heat to the evaporation plate 506.

A cryogenic cooling system 508 may be connected to the computing system 500. The cryogenic cooling system 508 may include a cryogenic tank 510 and an inlet pipe 512. The cryogenic tank 510 may provide storage for a cryogenic fluid. The inlet pipe 512 may provide a fluid pathway from the cryogenic tank 510 to the evaporation plate 506. The inlet pipe 512 may end at an opening 514. Cryogenic fluid may be released from the opening 514 onto the evaporation plate 506 to cool the evaporation plate 506 and the processor 504.

In accordance with at least one embodiment of the present disclosure, the computing system 500 may include insulation 528 between the evaporation plate 506 and other components 530 or hardware of the computing system 500. The other components 530 or hardware of the computing system 500 may include any other component used by or on a computing system 500. For example, the other components 530 or hardware of the computing system 500 may include one or more of memory, switches, batteries, supercapacitors, relays, any other component 530, and combinations thereof. In some embodiments, the other components 530 include processors not cooled by the cryogenic cooling system 508. For example, the other components 530 may include auxiliary processors used for the management of the computing system 500.

In some embodiments, the insulation 528 is located proximate to or at an edge of the evaporation plate 506. For example, the insulation 528 may be in contact with or offset from the edge of the evaporation plate 506. In some embodiments, the insulation 528 surrounds an entirety of the evaporation plate 506. In some embodiments, the insulation 528 is located proximate to or offset from a single edge of the evaporation plate 506. In some embodiments, the insulation 528 is located proximate to or offset from two or more edges of the evaporation plate 506. In some embodiments, the insulation 528 is located proximate to or offset from the edge of each evaporation plate 506 on the computing system 500. In some embodiments, the edge of the evaporation plate 506 is the external edge of the evaporation plate 506.

Insulating the evaporation plate 506 from the other components 530 may help to prevent the other components 530 from being the cold temperatures experienced by the evaporation plate 506. In some embodiments, the insulation 528 is located on the base 502 between the evaporation plate 506 and the other components 530. In some embodiments, the insulation 528 may be integrally formed in a gap between sections of the base 502. In some embodiments, the insulation 528 includes any type of insulation. For example, the insulation 528 may include an air gap, polystyrene, any other type of insulation, and combinations thereof.

In some embodiments, the insulation 528 thermally isolates the processor 504 and the evaporation plate 506 from the other components 530 of the base 502. In some embodiments, the insulation 528 prevents the temperature of the other components 530 of the base 502 from reducing to below a dewpoint of the surrounding environment or atmosphere. In this manner, the insulation 528 may help to prevent condensation from forming on or around the other components 530, thereby reducing or preventing condensation from dripping onto and damaging the other components 530.

Figure 6:
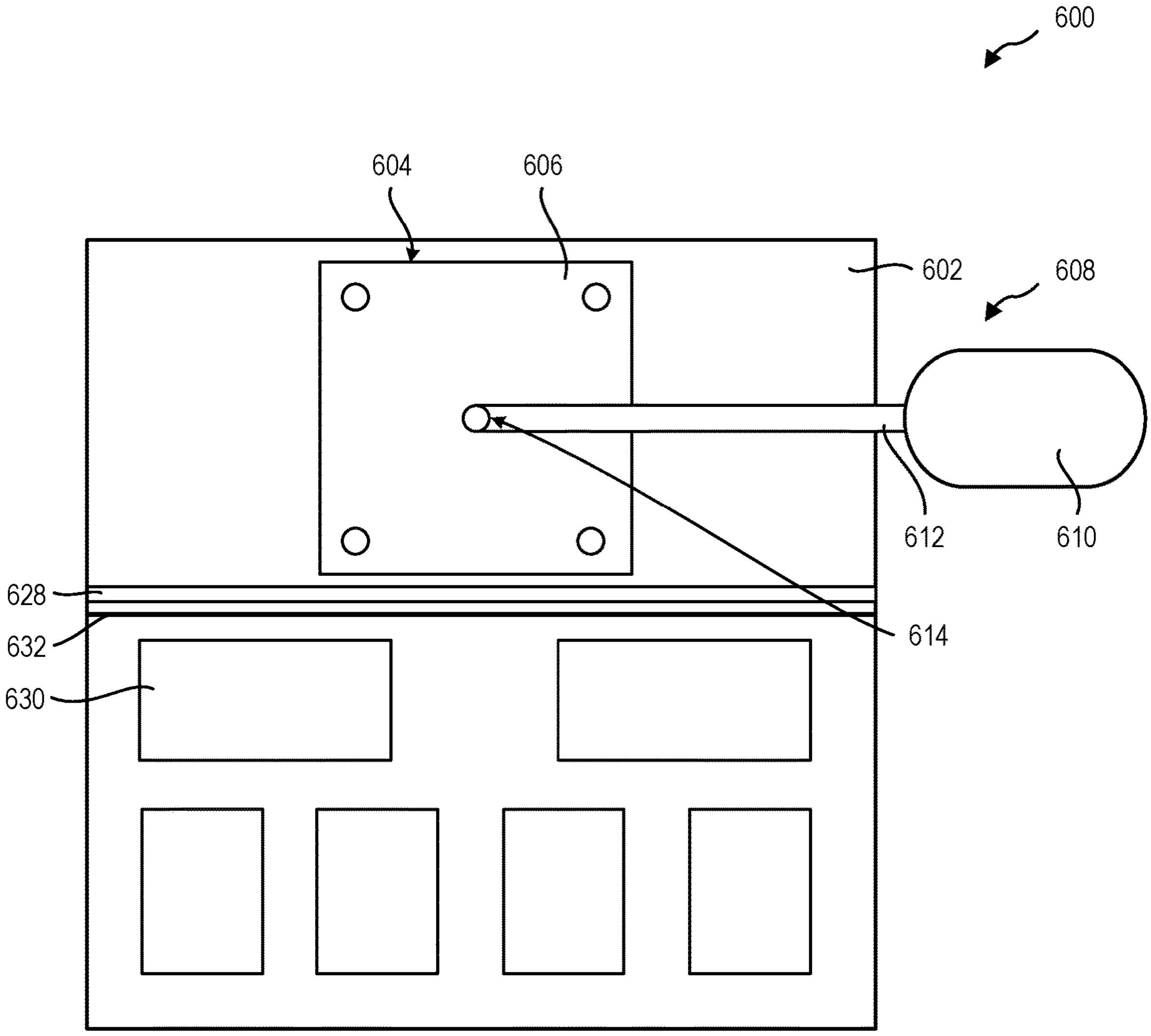
FIG. 6 is a representation of a computing system having a processor and an evaporation plate thermally connected to the processor, according to at least one embodiment of the present disclosure.

FIG. 6 is a representation of a computing system 600 having a processor 604 and an evaporation plate thermally connected to the processor, according to at least one embodiment of the present disclosure. The computing system 600 may include a base 602 such as a printed circuit board, server tray, or other base. The processor 604 may transfer heat to the evaporation plate 606.

A cryogenic cooling system 608 may be connected to the computing system 600. The cryogenic cooling system 608 may include a cryogenic tank 610 and an inlet pipe 612. The cryogenic tank 610 may provide storage for a cryogenic fluid. The inlet pipe 612 may provide a fluid pathway from the cryogenic tank 610 to the evaporation plate 606. The inlet pipe 612 may end at an opening 614. Cryogenic fluid may be released from the opening 614 onto the evaporation plate 606 to cool the evaporation plate 606 and the processor 604.

In accordance with at least one embodiment of the present disclosure, the computing system 600 may include insulation 628 between the evaporation plate 606 and other components 630 or hardware of the computing system 600. In some embodiments, the insulation 628 does not maintain the other components 630 at an operating temperature and/or above the dewpoint temperature. In some embodiments, the computing system 600 includes a heating element 632.

The heating element 632 may be located between the insulation 628 and the other components 630. The heating element 632 may help to increase the temperature of the other components 630 to an operating temperature and/or above the dewpoint of the surrounding environment and/or atmosphere. Put another way, the heating element 632 may help to mitigate or reduce the temperature drop caused by the cryogenic fluid cooling down the evaporation plate 606.

In some embodiments, the heating element 632 is any type of heating element. For example, the heating element 632 may be a resistive heating element. In some examples, the heating element 632 may be an inductive heating element. In some examples, the heating element 632 may be a radiative heating element with a warm fluid pumped therethrough. In some embodiments, the heating element 632 is any type of heating element used to maintain the temperature of the other components 630 above their operating temperature and/or above the dewpoint.

Figure 7:
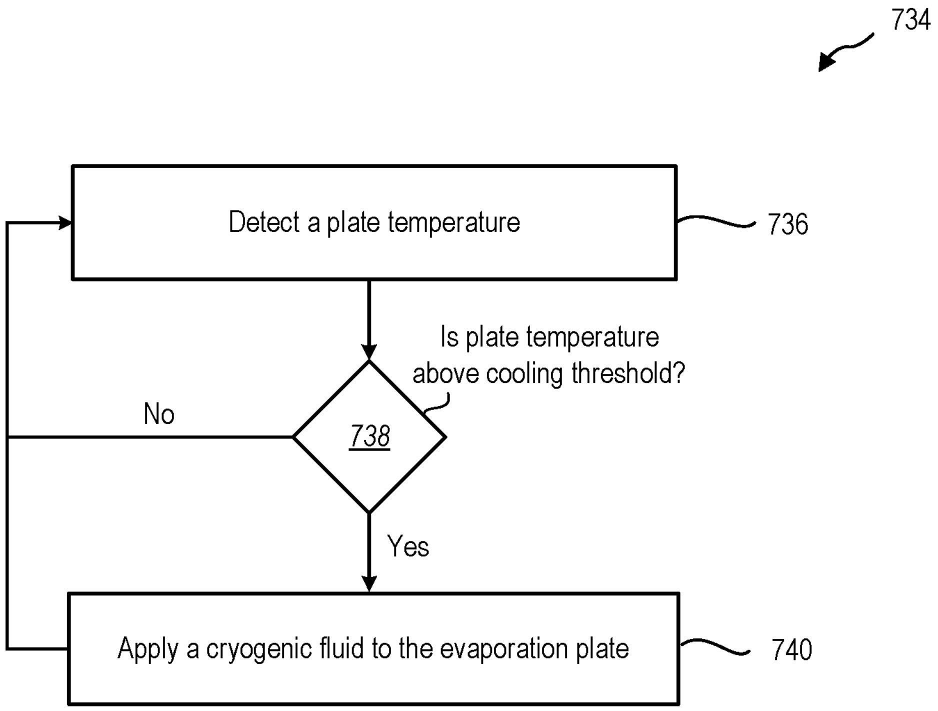
FIG. 7 is a flowchart of a method for cooling a computing device, according to at least one embodiment of the present disclosure.
Figure 8:
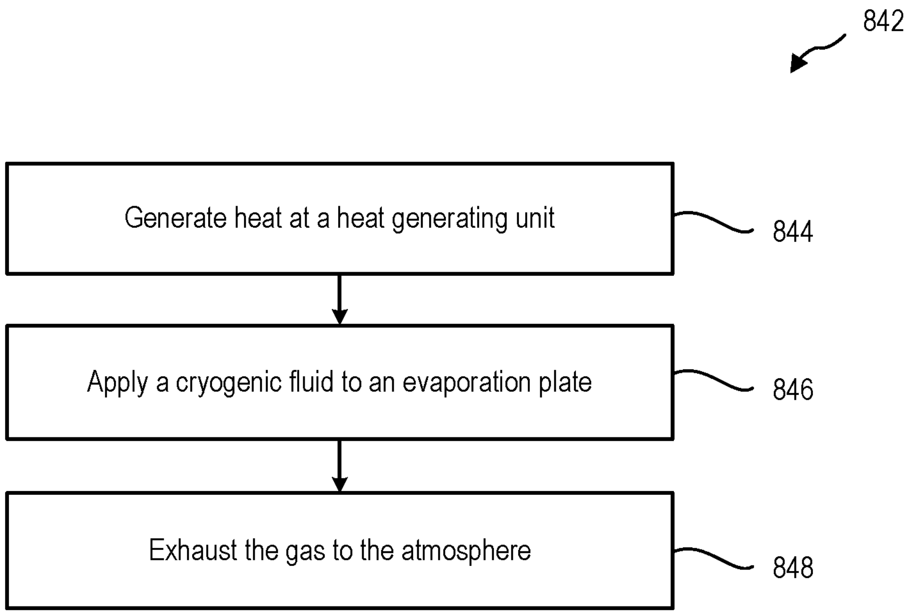
FIG. 8 is a flowchart of a method for cooling a computing device, according to at least one embodiment of the present disclosure.

FIGS. 7 and 8, the corresponding text, and the examples provide a number of different methods, systems, devices, and non-transitory computer-readable media of the cryogenic cooling systems discussed herein. In addition to the foregoing, one or more embodiments can also be described in terms of flowcharts comprising acts for accomplishing a particular result, as shown in FIG. 7 and FIG. 8. FIGS. 7 and 8 may be performed with more or fewer acts. Further, the acts may be performed in differing orders. Additionally, the acts described herein may be repeated or performed in parallel with one another or parallel with different instances of the same or similar acts.

As mentioned, FIG. 7 illustrates a flowchart of a method 734 or a series of acts for thermal management of a processor, in accordance with one or more embodiments. While FIG. 7 illustrates acts according to one embodiment, alternative embodiments may omit, add to, reorder, and/or modify any of the acts shown in FIG. 7. The acts of FIG. 7 can be performed as part of a method. Alternatively, a non-transitory computer-readable medium can comprise instructions that, when executed by one or more processors, cause a computing device to perform the acts of FIG. 7. In some embodiments, a system performs the acts of FIG. 7.

A cryogenic cooling system may detect a plate temperature of an evaporation plate thermally connected to a processor at 736. For example, the cryogenic cooling system may include a temperature sensor. The temperature sensor may be connected to the evaporation plate and configured to measure a plate temperature of the evaporation plate. In some embodiments, the temperature sensor is connected to the processor, and the temperature sensor may be configured to measure an operating temperature of the processor. In some embodiments, the cryogenic cooling system includes a plurality of temperature sensors. Multiple temperature sensors may be located at the evaporation plate and/or the processor.

The cryogenic cooling system may determine 738 whether the plate temperature is above a cooling threshold for the evaporation plate and/or the processor. In some embodiments, the cooling threshold is at or lower than the boiling point of the cryogenic fluid. If the plate temperature below the cooling threshold, then the cryogenic cooling system may continue to detect or monitor the plate temperature. If the plate temperature is above the cooling threshold, then the cryogenic cooling system may apply a cryogenic cooling fluid to the evaporation plate at 740. This may cause the cryogenic cooling fluid to reduce the temperature of the evaporation plate and/or the processor. In some embodiments, the method 734 is then repeated, and the cryogenic cooling system may continue to monitor the plate temperature. In this manner, the cryogenic cooling system may responsively apply cryogenic fluid to the evaporation plate as the plate temperature rises above the cooling threshold.

In some embodiments, the temperature sensor determines that the plate temperature has been reduced below the cooling threshold. In some embodiments, when the plate temperature has been reduced to below the cooling threshold, the cryogenic cooling system stops application of the cryogenic fluid to the evaporation plate. This may help to prevent the cryogenic fluid from running off of the evaporation plate and into other components of the computing device.

In some embodiments, the cryogenic cooling system measures or monitors a thermal output of the processor. For example, the temperature sensor may measure or monitor a rate of change of the temperature of the processor and/or the evaporation plate. The rate of change of the temperature may be associated with the thermal output of the processor. In some examples, the cryogenic cooling system may receive a power use and/or computing implementation of the processor. The power use and/or computing implementation may be associated with a thermal output of the processor.

As discussed herein, the cryogenic cooling system may have a variable flow. Put another way, the flow of the cryogenic fluid on to the evaporation plate may be variable. In some embodiments, the variable flow of the cryogenic fluid is adjusted based on the thermal output of the processor. For example, the variable flow of the cryogenic fluid may be adjusted to absorb the thermal output of the processor. In this manner, the cryogenic cooling system may maintain an operating temperature of the processor based on the thermal output of the processor. In some embodiments, the variable flow of the cryogenic fluid is adjusted based on the thermal output and environmental and/or atmospheric temperatures.

As mentioned, FIG. 8 illustrates a flowchart of a method 842 or a series of acts for thermal management of a processor, in accordance with one or more embodiments. While FIG. 8 illustrates acts according to one embodiment, alternative embodiments may omit, add to, reorder, and/or modify any of the acts shown in FIG. 8. The acts of FIG. 8 can be performed as part of a method. Alternatively, a non-transitory computer-readable medium can comprise instructions that, when executed by one or more processors, cause a computing device to perform the acts of FIG. 8. In some embodiments, a system performs the acts of FIG. 8.

The cryogenic cooling system may generate heat at a heat-generating unit at 844. The heat-generating unit may be thermally connected to an evaporation plate. In some embodiments, the cryogenic cooling system applies a cryogenic fluid to the evaporation plate at 846. The evaporation plate may cause the cryogenic fluid to change phase to a gas. The boiling point of the cryogenic fluid may be less than 273 K. The cryogenic fluid may then exhaust the gas of the cryogenic fluid to the atmosphere at 848.

In some embodiments, as discussed herein, the method 842 further includes detecting a plate temperature of the evaporation plate. Applying the cryogenic fluid may include applying the cryogenic fluid when the plate temperature is greater than the boiling point of the cryogenic fluid. In some embodiments, detecting the plate temperature includes detecting the thermal output of the processor. Applying the cryogenic fluid may include applying the cryogenic fluid with an application rate based on the thermal output. In some embodiments, when the plate temperature is reduced to below a cooling threshold, the cryogenic cooling system stops application of the cryogenic fluid to the evaporation plate.

In some embodiments, applying the cryogenic fluid includes opening a valve on an inlet pipe of the cryogenic cooling system. In some embodiments, the method 842 includes heating hardware or other components of the computing device. In some embodiments, heating the hardware of the computing device includes heating the hardware of the computing device above a dewpoint of an environment of the computing device.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A computing system, comprising:

a heat-generating component having a first operating mode and a second operating mode;

an evaporation plate thermally connected to the heat-generating component through a thermal interface material that has been flowed into a gap between the heat-generating component and the evaporation plate;

a thermal management device between the evaporation plate and the thermal interface material, wherein the thermal management device includes at least one of a vapor chamber or a cold plate; and a cryogenic cooling system positioned proximate to the evaporation plate, the cryogenic cooling system configured to release a cryogenic fluid onto the evaporation plate to cool the heat-generating component, the cryogenic fluid having a boiling point of less than 273 K, wherein the cryogenic cooling system is configured to release the cryogenic fluid onto the evaporation plate with a first rate when the heat-generating component is in the first operating mode and a second rate when the heat-generating component enters into the second operating mode.

2. The computing system of claim 1, wherein the cryogenic fluid is liquid nitrogen.

3. The computing system of claim 1, wherein the cryogenic cooling system is located above the evaporation plate.

4. The computing system of claim 1, wherein the cryogenic cooling system exhausts to atmosphere.

5. The computing system of claim 1, wherein the cryogenic cooling system has a variable flow rate of the cryogenic fluid between the first rate and the second rate.

6. The computing system of claim 1, further comprising insulation at an edge of the evaporation plate.

7. The computing system of claim 6, wherein the insulation is located between the heat-generating component and hardware of the computing system.

8. A cryogenic cooling system, comprising:

a cryogenic tank configured to store a cryogenic fluid having a boiling point of less than 273 K;

an inlet pipe providing fluid communication from the cryogenic tank to an opening in the inlet pipe, wherein the opening of the inlet pipe is configured to be located proximate to an evaporation plate thermally connected to a heat-generating component through a thermal interface material that has been flowed into a gap between the heat-generating component and the evaporation plate, wherein a thermal management device is disposed between the evaporation plate and the thermal interface material, wherein the thermal management device includes at least one of a vapor chamber or a cold plate; and a valve connected to the inlet pipe, the valve being actuatable to release the cryogenic fluid with a first rate and a second rate, the first rate based on a first operating mode of the heat-generating component and the second rate when the heat-generating component enters into a second operating mode.

9. The cryogenic cooling system of claim 8, wherein the cryogenic tank is configured to release the cryogenic fluid using gravity.

10. The cryogenic cooling system of claim 8, wherein the cryogenic tank stores the cryogenic fluid under positive pressure.

11. The cryogenic cooling system of claim 8, further comprising insulation around the inlet pipe.

12. A method for cooling a computing device, comprising:

generating heat at a heat-generating component when the heat-generating component is in a first operating mode, the heat-generating component being thermally connected to an evaporation plate through a thermal interface material that has been flowed into a gap between the heat-generating component and the evaporation plate wherein a cold plate is located between the evaporation plate and the thermal interface material;

applying, with a first rate when the heat-generating component is in the first operating mode a cryogenic fluid to the evaporation plate, the evaporation plate causing the cryogenic fluid to change phase to a gas, a boiling point of the cryogenic fluid being less than 273 K;

operating the cold plate by circulating a cold plate fluid through the cold plate during the first operating mode;

entering a second operating mode and generating heat at the heat-generating component when the heat-generating component is in the second operating mode;

applying, with a second rate when the heat-generating component enters into the second operating mode, the cryogenic fluid to the evaporation plate; and exhausting the gas of the cryogenic fluid to atmosphere.

13. The method of claim 12, further comprising detecting a plate temperature of the evaporation plate, wherein applying the cryogenic fluid includes applying the cryogenic fluid when the plate temperature is above the boiling point of the cryogenic fluid.

14. The method of claim 13, wherein detecting the plate temperature includes detecting a thermal output of the heat-generating component, and wherein applying the cryogenic fluid includes applying the cryogenic fluid with an application rate based on the thermal output.

15. The method of claim 13, further comprising, when the plate temperature is reduced below a cooling threshold, stopping application of the cryogenic fluid to the evaporation plate.

16. The method of claim 12, wherein applying the cryogenic fluid includes opening a valve on an inlet pipe of a cryogenic cooling system.

17. The method of claim 12, further comprising heating hardware of the computing device.

18. The method of claim 17, wherein heating the hardware of the computing device includes heating the hardware of the computing device above a dewpoint of an environment of the computing device.

19. The computing system of claim 1, wherein the cryogenic cooling system is configured to release the cryogenic fluid onto the evaporation plate to cool the heat-generating component without contacting the heat-generating component.

20. The method of claim 12, wherein circulating the cold plate fluid through the cold plate is independently operable from applying the cryogenic fluid to the evaporation plate.

* * * * *